(12) United States Patent
Faig et al.

(10) Patent No.: US 11,108,536 B1
(45) Date of Patent: Aug. 31, 2021

(54) METHOD AND APPARATUS FOR PERFORMING CLOCK AND DATA RECOVERY (CDR)

(71) Applicant: Mellanox Technologies, Ltd., Yokneam (IL)

(72) Inventors: Hananel Faig, Jerusalem (IL); David (Dima) Rohlin, Haifa (IL); Matan Groen, Kfar Saba (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/819,844

(22) Filed: Mar. 16, 2020

(51) Int. Cl.
*H04L 7/033* (2006.01)
(52) U.S. Cl.
CPC .................................. *H04L 7/0331* (2013.01)

(58) Field of Classification Search
CPC ............................ H04L 7/0331; H04L 7/033
See application file for complete search history.

(56) References Cited

U.S. PATENT DOCUMENTS

| | | | |
|---|---|---|---|
| 9,141,459 B2* | 9/2015 | Su | H04L 1/205 |
| 2014/0254730 A1* | 9/2014 | Kim | H04B 15/00 375/346 |
| 2016/0179595 A1* | 6/2016 | Wong | H04L 7/033 714/704 |
| 2019/0238149 A1* | 8/2019 | Dyer | H03M 1/08 |

* cited by examiner

*Primary Examiner* — Dac V Ha
(74) *Attorney, Agent, or Firm* — Alston & Bird LLP (57) ABSTRACT

A method for implementing an efficient clock recovery for multilane high-speed Serializer/Deserializer (SerDes) system having M interleaved lanes, has a non-recursive architecture.

16 Claims, 7 Drawing Sheets

METHOD AND APPARATUS FOR PERFORMING CLOCK AND DATA RECOVERY (CDR)

FIELD OF THE INVENTION

The present invention relates to Serializer/Deserializer (SerDes) systems. More particularly, the invention relates to a peripheral interface designed to seamlessly connect two parallel data interfaces over one single serialized high-speed data channel, thereby saving input/output (I/O) connections while preserving the overall parallel data rate.

BACKGROUND OF THE INVENTION

One of the main applications of SerDes is to connect the parallel interfaces of two System on Chip (SoC) devices over a single differential-pair line with the purpose either to minimize the number of physical I/O pins interconnections, or to transfer a single data channel between digital systems whose operating speed is slower than the data rate. For instance, while transferring parallel data from SoC #1 to SoC #2, the SerDes consists of two main functional blocks: a transmitting block located at SoC #1, and a receiving block located at SoC #2. Since each of the pins in the parallel interface of SoC #1 consists of a port that ultimately sends an independent data stream to the corresponding port in the parallel interface of SoC #2, each such data stream connection is referred to as a "digital lane". Thus, digital lanes may be thought of as a virtual parallel direct connection between corresponding ports of the interfaces of SoC #1 and SoC #2.

The transmitting block performs a parallel-in to serial-out function, namely, loads at once all the data values from the parallel interface of SoC #1, and transmits them serially, one-by-one via a single data channel, usually a single differential pair. The data values so transmitted are said to be "interleaved", namely each subsequent serial data value corresponds to a different pin of the parallel interface in a recurring pattern. The parallel data is updated periodically at once according to a timing signal referred to as the "digital clock" of period Td. Clearly, in order for the connection to be seamless, the transmission rate of the serial data stream must be fast enough so to complete within one digital clock period. Thus, if the parallel interface consists of N data ports, then the serial data rate must be at least N times higher than the overall data rate outputted by the parallel interface of SoC #1. In order to perform the above task, the transmitting block generates a "serial clock" signal of period Ts such that Ts=Td/N, synchronized with the digital clock. The serial data is transmitted in the form of voltage (or current) pulses using any suitable modulation scheme such as Pulse-Amplitude-Modulation (PAM), where different voltage values correspond to different combinations of bits. The most common form is binary modulation PAM2 (i.e. ±1V), with a pulse shape known as Non Return to Zero (NRZ), where a negative voltage value corresponds to a binary "0", and a positive voltage value corresponds to a binary "1". However, higher PAM levels can be used, such as PAM4 (i.e. ±1V, ±3V), where each voltage level corresponds to two binary values, thus reducing by a factor of two the required serial pulse rate. Regardless of modulation type, each one of the serial voltage pulses above is referred to as a "symbol". For the sake of simplicity, and without loss of generality, the explanation that follows assumes binary modulation, namely, the transmitted pulses may assume positive or negative values of identical amplitude.

The Receiving block performs a serial-in to parallel-out function, namely, detects and collects one-by-one the serial data values as they are received form the single differential-pair, reorders them in the original parallel order, and upon completing the reception of a full set of parallel data, presents the data at once in parallel form to the parallel input interface of SoC #2, together with the digital clock, as if the data was sent simultaneously over N parallel connections. In order to be capable to correctly detect the serial data values, the receiving block must precisely synchronize with the serial data in order to sample the received voltages at the appropriate instants. However, although the transmitted data is accurately synchronized with the serial clock, and the serial clock may be accurately recovered by one of the functions of the Clock and Data Recovery (CDR) circuit, this is not enough to ensure the proper detection of the serial data at the receiving end. The difficulty lies in the fact that at the receiving side, due to multiple factors affecting the serial data channel, such as noise, reactive line loading, digital hardware delays and group delay distortion, the received voltages representing the serial data values become distorted, and upon switching between negative and positive voltage values, the rising/falling edges of the symbols are crossing the zero line with a random time displacement referred to as "jitter". Moreover, the jitter is aggravated due to small frequency differences between the transmitter clock and receiver clock, referred to as "frequency drift", which introduce further zero-crossing inaccuracy.

When the serial data rate is high, the jitter may cover a substantial percent of the symbol duration, and cause an effective "narrowing" or "expanding" of the symbol pulse, so that the proper symbol voltage may occur before or after the instant originally designated by the serial clock, thus leading to a substantial error rate in the decoded data stream. While the jitter may be effectively treated in the case of a single lane, the art has failed to provide a cost-effective solution in the case of multiple interleaved lanes. It is an object of the present invention to overcome the abovementioned problem in a manner that is efficient and cost-effective.

It is another object of the invention to provide a method and apparatus suitable to properly advance or delay on-the-fly the recovered clock signal so that the probability of correct detection of symbols in interleaved multi-lane systems can be optimized according to predefined criteria, without requiring expensive equipment.

SUMMARY OF THE INVENTION

In one aspect, the invention relates to a method for implementing an efficient multilane Serializer/Deserializer (SerDes) system having M interleaved lanes and having a non-recursive architecture.

According to one embodiment, the method of the invention comprises:
a) providing circuitry adapted to extract M groups each of N samples of an analog signal;
b) for each lane, feeding each group of N samples to a hardware operator suitable to provide an error signal for said lane, so as to allow the execution of an early-late algorithm for said lane; and
c) providing circuitry adapted to combine the output of all M hardware operators thereby to perform an operation equivalent to a PLL lockup.

In another aspect, the invention relates to an efficient multilane Serializer/Deserializer (SerDes) system having M interleaved lanes, comprising:

a) circuitry adapted to extract M groups each of N samples of an analog signal;
b) for each lane, a hardware operator suitable to receive each group of N samples and to provide an error signal for said lane;
c) circuitry adapted to execute an early-late algorithm for said lane; and
d) circuitry adapted to combine the output of all M hardware operators thereby to perform an operation equivalent to a PLL lockup.

In one embodiment, the circuitry employs a Time Error Detection (TED) algorithm. In a specific embodiment, the TED algorithm is a an early-late algorithm.

BRIEF DESCRIPTION OF THE DRAWINGS

In the drawings.

In the drawings, "Pulse Gain Detector Output", "VCO_gain", and "Kpd", are used interchangeably.

DETAILED DESCRIPTION OF THE INVENTION

Figure 1:
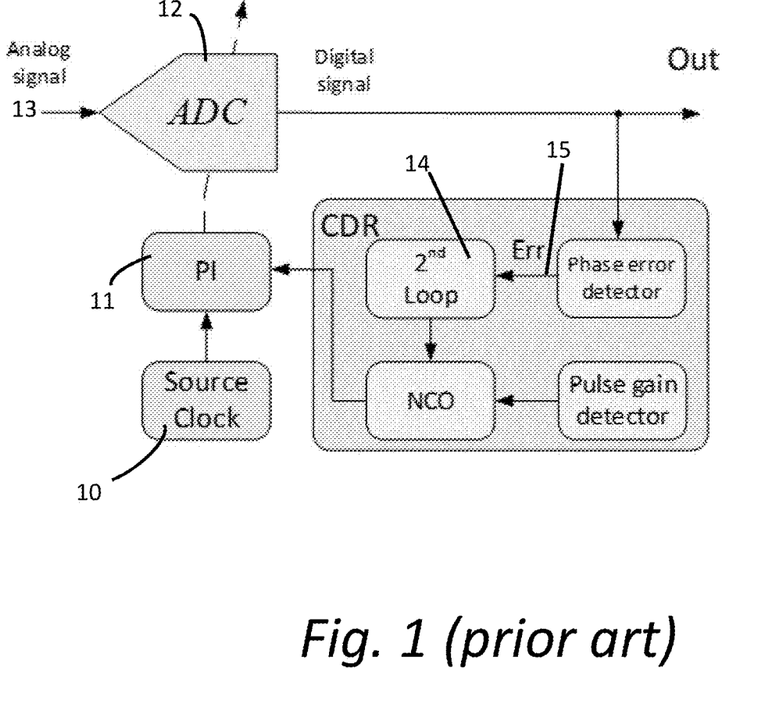
FIG. 1 is a block diagram of a prior art CDR solutions for a single-lane.

In many single-lane systems, a CDR circuit is used at the receiver end in order to recover the serial clock, align the sampling times, and sample the symbol waveforms at some "optimal" instants. In the case of a single-lane system, "optimal" may be taken in the sense that the average error rate on this single lane is minimized. This requires both recovering the clock frequency, and dynamically adjusting the sampling instant in order to compensate on-the-fly for the effect of jitter on the incoming data. In order to be able to compensate for the relative frequency drift between transmit clock and receive clock, which results in phase accumulation, the CDR must include an integrator, and therefore is implemented using a $2^{nd}$ order Phase Locked Loop (PLL). One of the prior art effective CDR solutions for a single-lane is shown in FIG. 1. In the circuit illustrated in the figure, a source clock 10, at frequency close to the estimated symbol rate (or, without loss of generality, a multi-phase set of clocks at lower frequency) is fed into a phase interpolator (PI) 11. The analog signal is sampled by the Analog-to-Digital Converter (ADC) 12 according to the timing provided by the transitions of the clock 10 fine-adjusted on-the-fly by the phase interpolator 11. The phase interpolator 11 has the capability to introduce delays in the clock waveform, thus both tuning the average clock frequency, and dynamically controlling the instant when the ADC samples the analog signal (indicated by arrow 13). Based on the sampled values, the digital signal is recovered, and the "phase error" (time error) with respect to the "optimal" sampling instant is estimated. In turn, the phase error is inserted into the $2^{nd}$ order loop 14, thus acting as a correction signal that makes the system stabilize so that the slow-moving average phase error value over the ongoing serial stream of symbols is minimized. This stable state is referred to as one in which the PLL is "locked".

Figure 2:
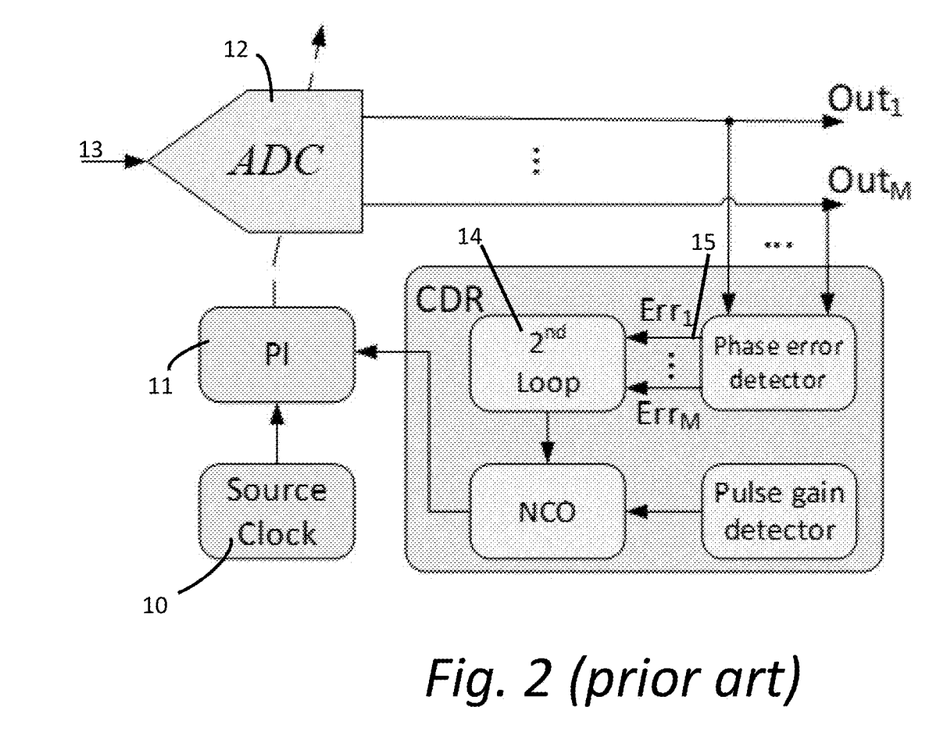
FIG. 2 is a block diagram of a prior art CDR with M parallel lanes.

However, when the system must transfer interleaved data, namely implementing parallel lanes, averaging the error over the whole serial data may not be desirable, as, for instance, it may result in one lane working with low error rate, while another working marginally or not at all. Moreover, in the case of a single data channel mentioned in the background section, one may want to exploit the underlying lanes to reduce the overall noise level. Thus in order to carry out a correct optimization, one must continuously detect the data from all the lanes in parallel, compute the phase error for each lane separately, and then build a correction signal that makes the system stabilize so that all the lanes are optimized in some sense, or in turn, different optimization priorities may be given to different lanes. This dictates modifying the CDR of FIG. 1 to the form schematically shown in FIG. 2. In this figure, as well as throughout this description, the same numerals are used to indicate the same components. However, as further illustrated hereinafter, the implementation of the multi-lane system in the form of FIG. 2, which is based on a $2^{nd}$ order loop architecture, is extremely demanding from both hardware duplication as well as cost standpoints. The invention seeks to remedy this problem by providing a minimal-hardware and low-cost solution.

Figure 3:
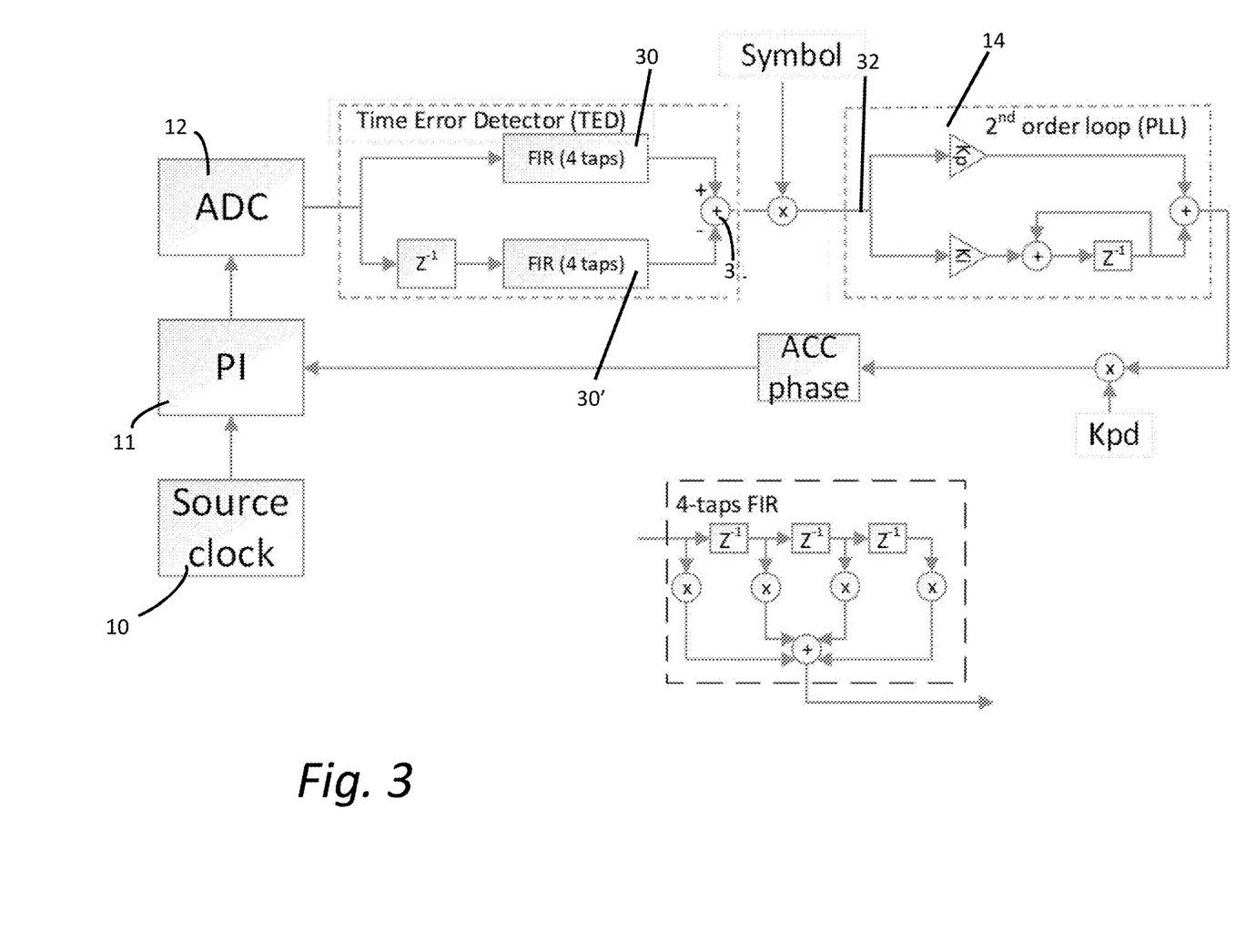
FIG. 3 shows an existing CDR implementation scheme for one lane.

FIG. 3 shows an existing CDR implementation scheme for one lane, which is parallel to the block diagram of FIG. 1, and, without loss of generality, uses a specific error-computing algorithm that will be discussed later. As shown in the figure, the serial symbols enter the ADC 12 and are sampled according to the PI-controlled clock 10. The time error detector consists of a couple of Finite Impulse Response (FIR) filters, 30 and 30', staggered by one sample shift, which effectively yields the difference between symbol samples spaced approximately one clock period apart. The FIR filters 30 and 30' are shown as being implemented in 4-taps for the sake of simplicity, but may be implemented with any desired number of taps. The FIR outputs are subtracted (as shown at 31), and the resulting value is multiplied by the signed value of the detected symbol voltage. This arrangement performs a mathematical action equivalent to an absolute operator. The resulting value 32 entering the $2^{nd}$ order loop is the "time error" (phase error) signal 15 of FIG. 1. The phase error so generated makes the PLL system 14 to stabilize to the "lock" state mentioned hereinbefore.

Figure 4:
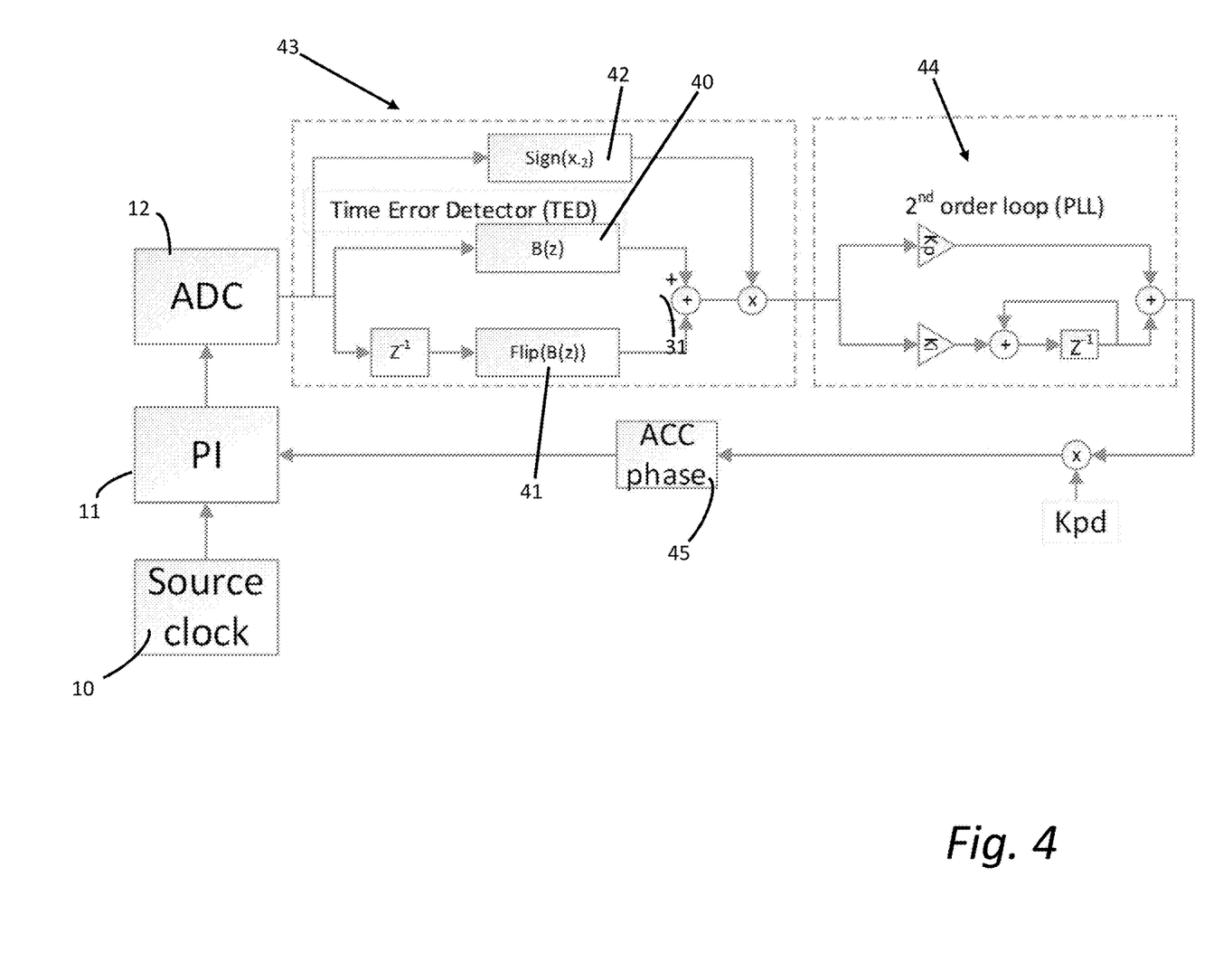
FIG. 4 shows a single lane modified CDR scheme.

In order to better illustrate an exemplary embodiment of the interleaved multi-lane CDR according to the invention, a few modifications are introduced into the existing single-lane implementation. The improved schematic diagram is shown in FIG. 4. The modifications introduced in FIG. 4, which will be easily understood by the skilled person, are as follows:

a) The upper FIR filter B(z) indicated by numeral 40 may be any interpolation filter. One possible filter implementation is the "raised cosine" form. The raised cosine filter is well fit as its impulse response (IR) decays rapidly so that few coefficients suffice for an effective filtering, and its shifted IRs suffer no inter-symbol interference (ISI).

b) The lower filter Flip(B(z)) indicated by numeral 41, is a "flipped" version of the upper filter. In other words, if the coefficients of B(z) 40 are $\{b_0, b_1, b_2, b_3\}$, and the coefficients of Flip(B(z)) 41 are $\{c_0, c_1, c_2, c_3\}$, then $c_0=b_3$, $c_1=b_2$, $c_2=b_1$, and $c_3=b_0$. Using the above approach, B(z) and Flip(B(z)) allow to implement an anti-symmetric filter required for the time error detector (TED), while reducing the filter complexity.

c) The block denoted by Sign($x_{-2}$) and indicated by numeral 42, simply returns the values±1, in correspondence to the sign of the sample value that multiplies the coefficient $b_2$ of B(z) 40. This allows providing a good estimate of the sign of the sample, and moreover, since no ISI is present, the middle point of the IR of a raised cosine filter coincides with one single sample. If the sample value whose sign is returned belongs to the sample $x_n$, the returned sign is denoted as $Q(x_n) \in \pm 1$. For 4-taps, on the average, the sign of $x_{-2}$ can replace the absolute operator mentioned before.

A detailed analysis of the operation of the CDR of FIG. 4 will assist in better understanding the invention. The following analysis assumes that the input to ADC 12 consists of a sequence of interleaved multi-lane symbols. In fact, the circuit of FIG. 4 acts as if the interleaved input consists of a single-lane input, and behaves according to the single-lane block diagram of FIG. 1. In the following description, the index 0 is used to denote present values, and negative indices to denote previous values. However, it should be understood that in all that follows, the analysis holds for any set of (time) shifted indices.

a) For the sake of clarity, the analysis is carried out for a set of five consecutive input samples $\{x_{-4}, x_{-3}, x_{-2}, x_{-1}, x_0\}$, where the index 0 denotes the present sample and negative indices denote previous samples. The above samples constitute the sequential inputs delivered by the ADC 12 to the block 43 (Time Error Detector (TED)).

b) The present value that constitutes the input to block 44 ($2^{nd}$ order loop (PLL)) is denoted as (PLL_in$_0$). This value is derived in a straightforward way from FIG. 4 and has the form $$PLL\_in_0 = Q(x_{-2})[(x_0 b_0 + x_{-1} b_1 + x_{-2} b_2 + x_{-3} b_3) - (x_{-1} c_0 + x_{-2} c_1 + x_{-3} c_2 + x_{-4} c_3)]$$

Substituting $c_0=b_3$, $c_1=b_2$, $c_2=b_1$, and $c_3=b_0$, in the flipped filter, finally obtains $$PLL\_in_0 = Q(x_{-2})[b_0(x_0 - x_{-4}) + (b_1 - b_3)(x_{-1} - x_{-3})]$$

It should be noted that only the sign of the central sample $x_{-2}$ (not its amplitude) has effect in this expression c) PLL_in$_0$ is in fact the "time error" (phase error) signal 15 of FIG. 1, and corresponds to a well-known algorithm denoted as "Early-Late", which is based on the assumption that if there is a point near $x_{-2}$ where a symbol pulse has maximal absolute amplitude, then samples taken at symmetrical distance from $x_{-2}$ should have similar amplitude. PLL_in$_1$ takes the following values:

1) Its value is zero if the PI 11 has set the clock position so that the sampling occurs at the point of maximal absolute amplitude of the symbol at the ADC 12 input. This is the desired sampling instant, since it is the point where the "pulse narrowing/expanding" effect due to jitter and drift has minimal influence on the amplitude.

2) Its value is positive if the PI 11 has set the clock position so that the sampling occurs before the symbol at the ADC 12 input reaches its maximal absolute amplitude. This is denoted as an "Early" sampling.

3) Its value is negative if the PI 11 has set the clock position so that the sampling occurs after the symbol at the ADC 12 input reaches its maximal absolute amplitude. This is denoted as a "Late" sampling.

In view of the above description, using the circuit of FIG. 4 with multi-lane interleaved input, again the error signal makes the (phase interpolator-controlled) clock position stabilize so that the global average error is optimized, which leaves the multi-lane optimization problem unsolved. The reason for this problem lies in the fact that circuits of FIG. 4 have a recursive architecture, in which at each new step, a full re-computation is carried out, and all the values at previous states are lost. In order to perform a multi-lane optimization, one needs to implement hardware resources for each parallel lane, in order to keep the values belonging to all the sequential states for all the lanes, until a full interleaving cycle has completed. Thus, if one wish to use a CDR circuit scheme similar to FIG. 4 to perform an optimization over M lanes, this implies duplicating M times several high-speed circuits, including multipliers, adders, and memories, which results in a large amount of high-speed hardware, with the associated cost and current consumption.

The invention addresses the abovementioned problem by providing circuits of a multi-lane CDR design, which have non-recursive architecture, while still performing the PLL action as before. In order to illustrate how this is done an accurate mathematical expression describing the PI input as a function of the input samples from ADC needs first to be established. Accordingly, the invention provides a non-recursive hardware circuit that allows to perform the same PLL task as in FIG. 4, together with multi-lane optimization, while requiring a modest hardware investment as compared to the prior art. In the context of this invention, the term "non-recursive architecture" refers to hardware architecture adapted to keep the values belonging to all the sequential states for all the lanes available, until a full interleaving cycle has completed. This result is accomplished, inter alia, by a thorough analysis of the recursive behavior of FIG. 4, and then rearranging, swapping, and consolidating adders and multipliers so as to lower the number of operators thus leading to an economical hardware implementation. The invention will be illustrated hereinafter through exemplary embodiments thereof, it being understood that it allows to provide different practical hardware solution, and therefore the embodiments described herein are merely illustrative and are not intended to limit the invention in any way.

Referring now to FIG. 4, the lower branch in block 44 ($2^{nd}$ order loop (PLL)), consists of an integrator, and the final integration value is found at the output of the delay block denoted by $z^{-1}$.

a) The final integration value resulting at the end of the previous interleaving cycle is denoted by $xi_{-1}$.

b) Kpd is a multiplying factor that translates amplitude to phase. For the sake of simplicity and for the purposes of this explanation it can be taken to equal unity.

c) The $I^{th}$ recursive value at the output of the of block 44 is denoted by PLL_out$_i$.

d) Block 45 (ACC phase) is an adder that sums up the recursive values PLL_out$_i$.

e) The value at the input of the phase interpolator PI 11 at the end of the present full interleaving cycle is denoted by PI$_{in}$.

A straightforward computation of the signal PI$_{in}$ yields the following result (Eq. 1):

$$PI_{in} = \sum_{l=0}^{M} PLL\_out_l =$$

-continued $$M \cdot (K_i \cdot xi_{-1}) + (K_i + K_p) \sum_{l=0}^{M} \text{PLL\_in}_l + K_i \sum_{l=0}^{M-1} ((M-1)-l) \cdot \text{PLL\_in}_l =$$

$$M \cdot (K_i \cdot xi_{-1}) + \sum_{l=0}^{M-1} \text{PLL\_in}_l \cdot (K_p + K_i(M-l))$$

The above result may be rearranged in the form (Eq. 2):

$$PI_{in} = M \cdot (K_i \cdot xi_{-1}) + + (K_i + K_p) \cdot \{b_0 \cdot [Q(x_{M-3}) \cdot (x_{M-1} - x_{M-5})] + (b_1 - b_3) \cdot [Q(x_{M-3}) \cdot (x_{M-2} - x_{M-4})]\} + (2K_i + K_p) \cdot \{b_0 \cdot [Q(x_{M-4}) \cdot (x_{M-2} - x_{M-6})] + (b_1 - b_3) \cdot [Q(x_{M-4}) \cdot (x_{M-3} - x_{M-5})]\} + \ldots + (M \cdot K_i + K_p) \cdot \{b_0 \cdot [Q(x_{-2}) \cdot (x_0 - x_{-4})] + (b_1 - b_3) \cdot [Q(x_{-2}) \cdot (x_{-1} - x_{-3})]\}$$

Equation 2 can be implemented using circuits based on non-recursive elements, so that the values for each state in the interleaving cycle are preserved during the all cycle, while rearranging and recombining the multiplication and additions thereby reducing the number of required hardware operators.

In the following examples, "Kpd", "VCO_gain" and "pulse_gain_detector's output" have the same meaning.

Example 1

Figure 5A:
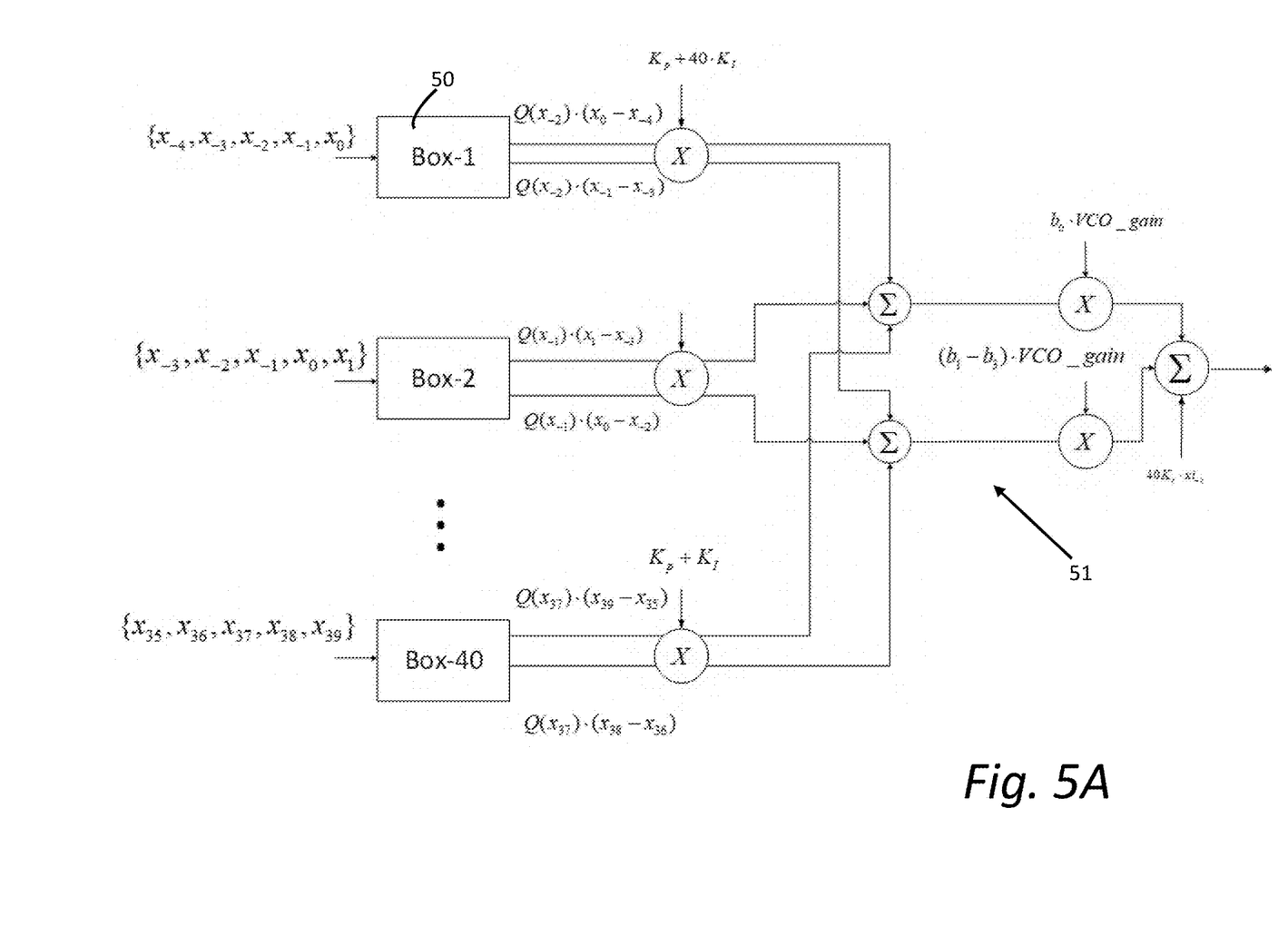
FIG. 5A is an exemplary embodiment of an interleaved 40-lane CDR according to the invention.
Figure 5B:
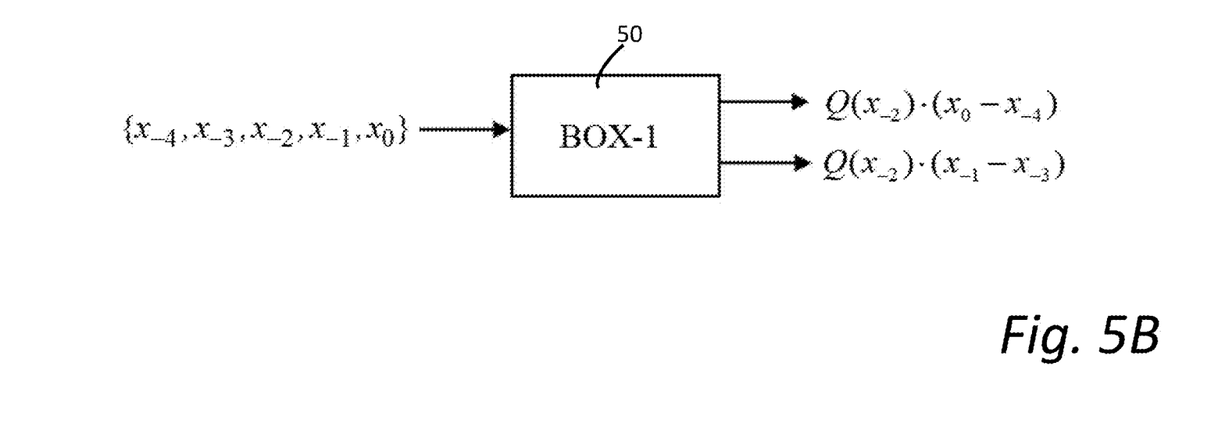
FIG. 5B shows an exemplary configuration of an operator of FIG. 5A, for n=0.
Figure 5C:
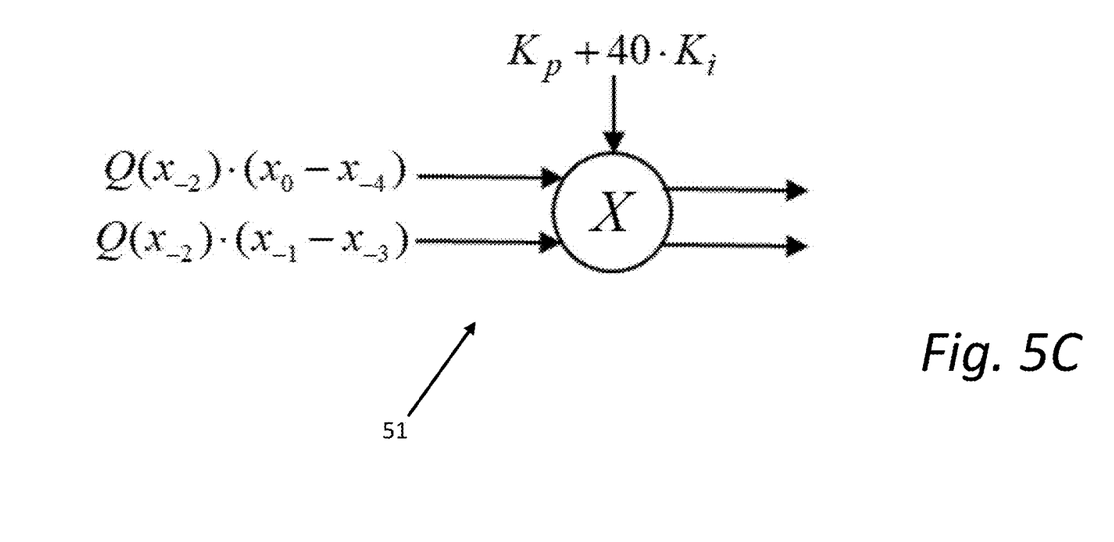
FIG. 5C shows an exemplary configuration of another operator of FIG. 5A, for n=0.

An exemplary embodiment of an interleaved 40-lane CDR is shown in FIG. 5 (A-C).

With reference to FIG. 5A, the following hardware operators, which are all straightforward applications of digital adders and multipliers, well-known to any person skilled in the art, are defined below:

a) BOX-(n+1), n=0, 1, 2, ..., 39: this hardware operator, the first of which is indicated in the figure by numeral 50, accepts 5 input samples indexed $\{x_{n-4}, x_{n-3}, x_{n-2}, x_{n-1}, x_n\}$, and outputs two values $Q(x_{n-2}) \cdot (x_n - x_{n-4})$ and $Q(x_{n-2}) \cdot (x_{n-1} - x_{n-3})$ FIG. 5B shows an exemplary operator 50 configuration for n=0.

b) Twin I/O multiplier operator 51: this hardware operator accepts the two values from the BOX-(n+1) operator, and returns both values multiplied by $K_p + (40-n) \cdot K_i$ at its output.

FIG. 5C shows an exemplary operator configuration for n=0.

c) additional standard multipliers and adders are also used, and Kpd is renamed as VCO_gain.

As can be readily appreciated, the "time error" (phase error) values for all lanes are available at all times during the full interleaving cycle, while the overall PLL functionality is maintained, with no recursive computations.

Example 2

Figure 6:
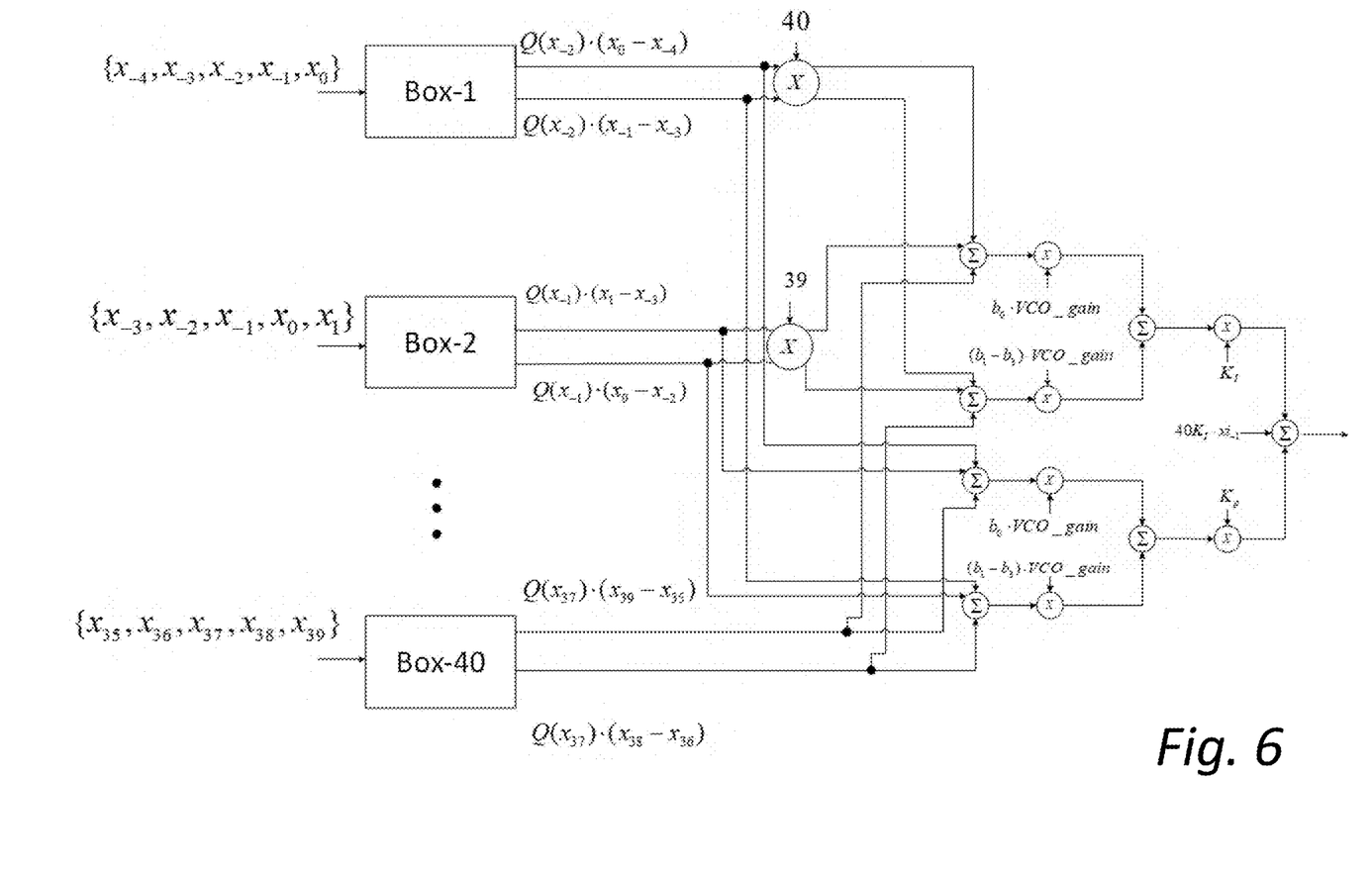
FIG. 6 is an alternative exemplary embodiment of an interleaved 40-lane according to the invention.

An alternative embodiment of the circuit of FIG. 5 is shown in FIG. 6. As compared to the embodiment of FIG. 5, in this embodiment Equation 2 is implemented with a different rearrangement of the operators thus yielding a different hardware configuration that performs the same task as in Example 1. The choice of a specific hardware implementation among the possible ones, may be done so to optimally exploit the available hardware resources for each specific case.

The invention claimed is:

1. A method for efficient multilane Serializer/Deserializer (SerDes) systems, the method comprising:
   receiving a data stream, wherein the data stream comprises a plurality of interleaved lanes, wherein each of the plurality of interleaved lanes comprises a plurality of samples;
   determining, via a non-recursive architecture, an error signal for each of the plurality of interleaved lanes, wherein the error signal for each of the plurality of interleaved lanes is available during a full interleaving cycle;
   generating a correction signal based upon the error signal for each of the plurality of interleaved lanes; and
   sampling the data stream based upon the correction signal.

2. The method according to claim 1, wherein determining the error signal for each of the plurality of interleaved lanes further comprises executing an early-late algorithm for each lane.

3. The method according to claim 1, wherein determining the error signal for each of the plurality of interleaved lanes further comprises employing a Time Error Detection (TED) algorithm.

4. The method according to claim 3, wherein the TED algorithm further comprises an early-late algorithm.

5. The method according to claim 1, wherein the full interleaving cycle comprises a time during which the error signal for each of the plurality of interleaved lanes is determined.

6. The method according to claim 1, wherein the plurality of samples are extracted from an analog signal.

7. The method according to claim 6, further comprising generating a digital signal based upon the sampled data stream.

8. The method according to claim 1, wherein sampling the data stream based upon the correction signal further comprises augmenting a sampling rate of Clock and Data Recovery (CDR) circuitry based upon the correction signal.

9. An efficient multilane Serializer/Deserializer (SerDes) system comprising:
   circuitry configured to receive a data stream, wherein the data stream comprises a plurality of interleaved lanes, wherein each of the plurality of interleaved lanes comprises a plurality of samples;
   a non-recursive architecture configured to determine an error signal for each of the plurality of interleaved lanes, wherein the error signal for each of the plurality of interleaved lanes is available during a full interleaving cycle;
   circuitry configured to generate a correction signal based upon the error signals for each of the plurality of interleaved lanes; and
   circuitry configured to sample the data stream based upon the correction signal.

10. The system according to claim 9, wherein the non-recursive architecture is configured to determine the error signal for each of the plurality of interleaved lanes by executing an early-late algorithm for each lane.

11. The system according to claim 9, wherein the non-recursive architecture is configured to determine the error signal for each of the plurality of interleaved lanes by employing a Time Error Detection (TED) algorithm.

12. The system according to claim 11, wherein the TED algorithm further comprises an early-late algorithm.

13. The system according to claim 9, wherein the full interleaving cycle comprises a time during which the determination of the error signal for each of the plurality of interleaved lanes occurs.

14. The system according to claim 9, wherein the plurality of samples are extracted from an analog signal.

15. The system according to claim 14, further comprising generating a digital signal based upon the sampled data stream.

16. The system according to claim 9, wherein the circuitry configured to sample the data stream based upon the correction signal is further configured to augment a sampling rate of Clock and Data Recovery (CDR) circuitry based upon the correction signal.

* * * * *